(12) United States Patent
de Buda

(10) Patent No.: US 8,461,823 B2
(45) Date of Patent: Jun. 11, 2013

(54) SYSTEM FOR METERING ELECTRICITY BY INTEGRATING IN-PHASE CURRENT

(75) Inventor: Eric George de Buda, Toronto (CA)

(73) Assignee: Grid2020, Inc., Hokes Bluff, AL (US)

( * ) Notice: Subject to any disclaimer, the term of this patent is extended or adjusted under 35 U.S.C. 154(b) by 0 days.

(21) Appl. No.: 12/351,978

(22) Filed: Jan. 12, 2009

(65) Prior Publication Data
US 2010/0007336 A1    Jan. 14, 2010

Related U.S. Application Data

(63) Continuation-in-part of application No. 12/172,112, filed on Jul. 11, 2008, now Pat. No. 7,940,039.

(51) Int. Cl.
  *G01R 1/00* (2006.01)
  *G01R 15/18* (2006.01)

(52) U.S. Cl.
  USPC .............................. 324/110; 324/126; 324/127

(58) Field of Classification Search
  None
  See application file for complete search history.

(56) References Cited

U.S. PATENT DOCUMENTS

| | | | |
|---|---|---|---|
| 3,226,641 A * | 12/1965 | Miller | 324/142 |
| 4,056,774 A * | 11/1977 | Shum | 324/142 |
| 4,459,546 A * | 7/1984 | Arrington et al. | 324/142 |
| 4,783,748 A | 11/1988 | Swarztrauber et al. | |
| 5,212,441 A * | 5/1993 | McEachern et al. | 324/142 |
| 6,462,519 B1 * | 10/2002 | McDaniel et al. | 323/211 |
| 6,947,854 B2 | 9/2005 | Swarztrauber et al. | |
| 7,054,770 B2 | 5/2006 | Swarztrauber et al. | |
| 2003/0158677 A1 | 8/2003 | Swarztrauber et al. | |
| 2005/0137813 A1 | 6/2005 | Swarztrauber et al. | |
| 2006/0259254 A1 | 11/2006 | Swarztrauber et al. | |
| 2007/0271047 A1 * | 11/2007 | Tan et al. | 702/64 |

FOREIGN PATENT DOCUMENTS

CA     2401579     9/2001

* cited by examiner

*Primary Examiner* — Vinh Nguyen
(74) *Attorney, Agent, or Firm* — Ann I. Dennen; Lanier Ford Shaver & Payne P.C.

(57) ABSTRACT

There is disclosed a method of metering electricity that includes calculating a first accumulated in-phase current indicative of a non-voltage component of energy flow to one or more customer premises during a period of time by a distribution transformer meter (DTM) coupled to a distribution transformer (DT) and calculating second accumulated in-phase current (AIPC) indicative of a non-voltage component of energy flow during a period of time by a feeder current meter coupled to a feeder line. The method further includes transmitting the first AIPC and the second AIPC to a data collecting computing device and comparing the first AIPC with the second AIPC to determine if electricity theft has occurred.

4 Claims, 2 Drawing Sheets

SYSTEM FOR METERING ELECTRICITY BY INTEGRATING IN-PHASE CURRENT

CROSS REFERENCE TO RELATED APPLICATION

This application is a continuation in part of U.S. patent application Ser. No. 12/172,112 filed Jul. 11, 2008, now U.S. Pat. No. 7,940,039, the entirety of which is incorporated herein by reference.

FIELD OF THE INVENTION

The invention relates generally to methods for monitoring an electric distribution network and for detecting the theft of electricity.

BACKGROUND OF THE INVENTION

With rising energy prices, concerns about the environment, and an increased emphasis on energy conservation, there has been an increased interest in the detection and prevention of electricity theft. Theft directly from a high voltage feeder can be done by the unauthorized installation of a non-utility owned distribution transformer on the feeder. The utility would not necessarily know about the existence of such a transformer and thus a comparison between energy supplied by the utility owned distribution transformers and the energy consumed by the end-users would not detect this kind of electricity theft. To detect this kind of theft, it is necessary to measure consumption at the feeder level. A feeder meter, according to the state of the art, measures energy supplied by the feeder. This requires multiplying voltage and current to determine power and integrating the power over a period of time to determine energy. Theft could be detected by comparing the energy supplied by the feeder with the energy supplied by the distribution transformers on that feeder. A major disadvantage of this approach is that the feeder meter must be designed and built for high voltage operation. High voltage devices are expensive and depending on the design, can be hazardous to install. Furthermore, voltage drops occur in every feeder due to current flow and line resistance, and these voltage drops are a source of measurement error in the comparison. Increased measurement error means that more feeder meters are needed for a given number of distribution transformers in order to be able to distinguish between measurement error and theft.

Configuration information is an important input to the theft detection equations. It is necessary to know which end-users are connected to which distribution transformers, and to know which distribution transformers are associated with which feeder meters and how. The traditional method of maintaining configuration information is to develop a series of maps showing the distribution system components and how they are interconnected. This is an expensive labour intensive process, and often these maps are not kept up-to-date.

SUMMARY OF THE INVENTION

In accordance with one aspect of the present invention, there is provided a method of monitoring an electrical network of the type having a feeder line connected to a plurality of distribution transformers, each distribution transformer being in turn coupled to a load. The method includes the steps of recording an accumulated in-phase current at each of the distribution transformers over a time period and recording for the same time period an accumulated in-phase current at the feeder line. The sum of the accumulated in-phase currents recorded at the distribution transformers are then compared to the accumulated in-phase current recorded at the feeder line.

In accordance with another aspect of the invention there is provided a method of monitoring an electrical network having a feeder line connected to a plurality of distribution transformers which are in turn connected to at least one customer meter. The method includes the steps of recording an accumulated in-phase current at the feeder line for a time period and, for the same time period, recording an accumulated in-phase current at each of the customer meters. The accumulated in-phase current recorded at the feeder line is then compared to a sum of the accumulated in-phase currents recorded at the customer meters.

In accordance with another aspect of the invention there is provided a method of monitoring an electrical network having a distribution transformer connected to at least one customer meter, the method including the steps of recording an accumulated in-phase current at the distribution transformer and at each of the customer meters. The method further includes the step of comparing the accumulated in-phase current recorded at the distribution transformer with the sum of the accumulated in-phase currents recorded at the customer meters.

With the foregoing in view, and other advantages as will become apparent to those skilled in the art to which this invention relates as this specification proceeds, the invention is herein described by reference to the accompanying drawings forming a part hereof, which includes a description of the preferred typical embodiment of the principles of the present invention.

DESCRIPTION OF THE DRAWINGS

In the drawings like characters of reference indicate corresponding parts in the different figures.

DETAILED DESCRIPTION OF THE INVENTION

Figure 1:
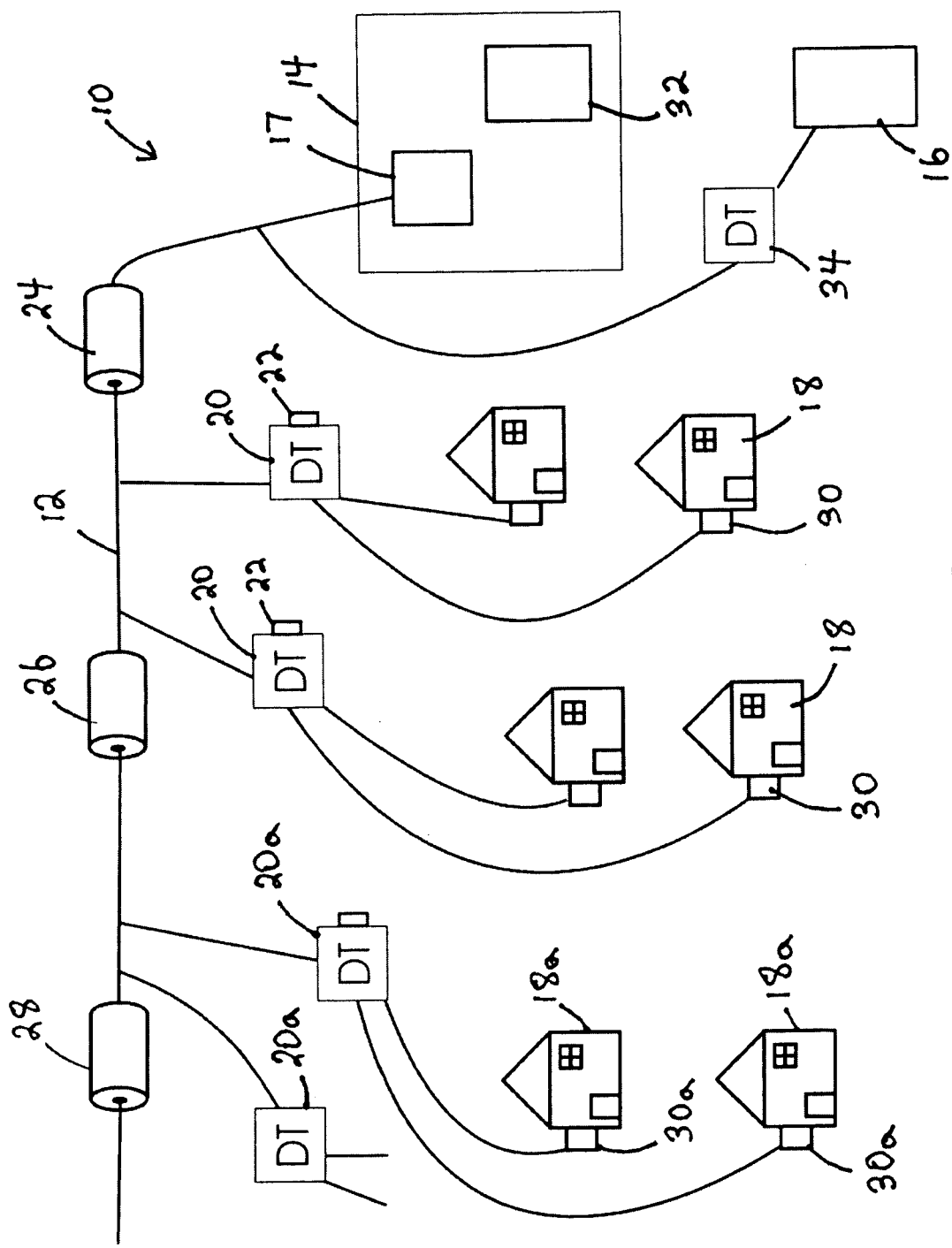
FIG. 1 is a schematic view of an electricity network implementing the method of the present invention.

Energy accounting as a method of detecting electricity theft can be very effective at the distribution transformer level because of the small number of customers involved. Errors due to line losses may be 0.5% to 3% and the number of customers may be no more than ten. In this case the total amount of energy lost to the lines would amount to no more than a fraction of the amount used by a single customer, and an even smaller fraction of the amount likely to be involved in any theft.

At the feeder level, the situation is different because many more customers are involved. Here the energy lost in the lines is likely to be many times greater than the amount used by a single customer. Thus, the detection of theft is more difficult, and the sensitivity and reliability of the method is heavily dependent on the accuracy of the energy accounting process.

An improvement in the accuracy of the energy accounting process can be achieved by estimating the line losses and compensating for them, but there is a serious conceptual problem which limits the benefit that this can afford. The problem is that line losses are proportional to the square of the current level and therefore vary with load, and that's without even taking into account variable losses due to line resistance changing with temperature. This makes it very difficult to know what these losses are with sufficient accuracy.

For example, if we have a feeder which is supplying 100 Amps to a steady unchanging load consisting of residential customers, the line losses might amount to 1%. If, however, during one measurement interval, the load changes such that half the time the load is 200 Amps and the rest of the time the load is zero, the result will be that line losses during the measurement period are doubled. Instead of 1%, the line losses would be 2%. Since this change occurs within a measurement interval, it cannot be detected from the meter data.

For a feeder with 1000 customers, a change in line losses from 1% to 2% represents a reduction of energy flow to customers, equivalent to ten times the load of an average customer.

There are a number of ways to cope with this. One can reduce the error by reducing the measurement interval, but this increases the amount of data that must be transmitted and processed and doesn't totally solve the problem. One can attempt to depend on statistical averaging, but this only works most of the time. Thus one is left with a trade-off between sensitivity and the prevention of false alarms. If the threshold is set too low, there will be too many false alarms. If the threshold is set too high, actual theft will not be detected. In between these two levels will be a range of threshold values which cause too many false alarms and fail to detect real theft.

Thus, energy accounting as a method of theft detection has an inherent source of error which is independent of accuracy of the instrumentation used. Even if the feeder meter(s), the distribution transformer meters, and the customer meters were totally error free, this method would still have a major source of error which would limit its sensitivity, and therefore its ability to detect electricity theft.

An alternative method which does not possess this source of error is to use Accumulated In-Phase Current (AIPC). AIPC is simply the non-voltage component of energy, thus removing the voltage term from the equation. Since line losses are characterized by voltage losses rather than current losses, this method is virtually immune to the effect of line losses. This means that higher levels of overall accuracy can be achieved, which translates into greater sensitivity, and therefore a greater ability to detect theft, limited primarily by the metering accuracy. Thus, AIPC provides a measure for theft detection that is superior to the use of energy consumption (kWh).

The term "feeder meter" is a general term for meters which measure electricity at the feeder level. A feeder current meter is a type of feeder meter which is specifically designed to measure feeder current. As such, it is ideally suited to the measurement of AIPC, and does not need to measure voltage, unlike other feeder meters.

In a system of feeder current meters (FCMs), distribution transformer meters (DTMs) and customer meters (CMs), AIPC provides the best means for detecting theft as it is independent of varying line losses. One difficulty with this concept is that CMs generally do not provide AIPC data, and of course, AIPC cannot be compared with kWh. However, if DTMs are used, they can be programmed to provide both AIPC and kWh. Then kWh can be used to reconcile between the DTMs and the CMs (where small numbers of customers are involved) while AIPC is used to reconcile between the FCMs and the DTMs (where larger numbers of customers are involved).

In certain situations, such as rural areas where there is only one customer per transformer, it may be considered to be undesirable to deploy DTMs. In such a case, the customer meters could be supplied with the ability to transmit both the energy consumption reading, and the Accumulated In-Phase Current reading. The energy consumption reading would be used for billing, while the AIPC reading would be used together with the feeder current meter reading to detect theft with greater sensitivity and reliability than would be possible using energy consumption data.

The most accurate approach, and the one which would be the most sensitive to theft and least likely to generate false alarms, would be to add a true AIPC capability to the CMs. The problem with this is the amount of development required by the meter manufacturers to implement this capability. Nevertheless, by using the existing capability in the meter one could achieve a close approximation. The CMs in addition to transmitting the accumulated kWh for each one hour period would also transmit the maximum voltage and the minimum voltage. From this data one could determine the maximum possible AIPC and the minimum possible AIPC as follows:

$$\text{Maximum AIPC} = kWh/\text{Minimum Voltage}$$

$$\text{Minimum AIPC} = kWh/\text{Maximum Voltage}$$

To compare the AIPC at the feeder level with the AIPC at the transformer secondary level, it is necessary to account for the transformer transformation ratio which is the primary side voltage divided by the secondary side voltage. A simple way to do this is to convert AIPC to normalized active energy or NAE by multiplying AIPC by the nominal voltage. This is done as follows:

$$\text{NAE} = \text{normalized active energy} = \text{AIPC} \times \text{nominal voltage}$$

The theft alarm is triggered if the feeder current meter NAE minus the error margin is greater than the sum of the NAE readings at the CMs. The sensitivity of this technique, in terms of the minimum theft load needed for detection, for each one hour period can be evaluated as follows:

$$\text{Min Detectable Theft Load} = \text{Voltage} \times (\text{Max AIPC} - \text{Min AIPC}) + \text{error margin}$$

This technique will have the highest sensitivity during periods of constant voltage, and yet during periods of changing voltage, false alarms will still be minimized. Since the targeted theft loads are base-load in nature, they should be readily detectable during periods of high sensitivity. Furthermore, sensitivity can be substantially enhanced during any one hour measurement period simply by subdividing the hour into five-minute measurement intervals. The sensitivity would then be limited by the amount of voltage change occurring during the five minutes. This is likely to be small in any normal situation, so that it should generally be possible to maintain high sensitivity at all times with this technique.

Since the sensitivity of any theft detection system varies inversely with the number of customers, it is beneficial to use multiple FCMs on a feeder such that each FCM (feeder current meter) covers a different subset of the customers on that feeder. This will only work where the feeder branches into different sections. In this case, different feeder meters can be installed on each branch. In cases where this can be done, there is still the problem that the line from the substation to the first branch (or customer) would need to be protected, and yet on this line the number of customers cannot be subdivided. This section of line can be protected by two FCMs, one at the substation, and one just before the first customer, both of them measuring RMS (root-mean-squared) current. RMS current can be measured more accurately than kWh or even AIPC because there is only one input into the measurement process. Accuracy can be further enhanced by calibrating two identical FCMs together, thus giving this section of line the best possible protection against theft.

The standard feeder current meter does not have a connection across high voltage, but voltage information is needed to calculate kWh. A standard method would be to use a shielded resistive voltage divider or a potential transformer, each method having its own unique advantages and disadvantages. Both methods can provide superior accuracy, but are expensive and inconvenient when accuracy is required. An alternative method is to measure the voltage on the secondary side of an existing distribution transformer and then multiply by the turns ratio.

This method could be implemented by a device which clamps onto the distribution transformer near the location of the feeder current meter (FCM). This device would measure voltage and current and combine them to produce voltage data for the primary side. This data would be continuously transmitted in real time, via short range radio, to the FCM which would use it to provide kWh data.

There are two main sources of error with this approach. The first is the accuracy of the turns ratio, and the second is the drop in voltage output as the transformer is loaded.

If the transformer meets the CSA specification, the turns ratio (rated high voltage/rated low voltage on nameplate) will be within ±0.5%. Also the transformer impedance (typically 1% to 3%) shown on the nameplate will be accurate to within ±5%. Thus one could measure the load current and use this data to compensate for the voltage drop in the transformer. If one assumes an instrumentation error of 0.15% for both the voltage and the current measurements, then the overall worst case high voltage measurement error for a transformer with 3% impedance would be:

$$3\% \times 5\% + 0.15\% + 0.5\% + 0.15\% = 1\%.$$

This level of accuracy would only be suitable in situations where small numbers of customers are involved as would be true of any theft detection system which is based on kWh. The irony of this is that the extra expense and other drawbacks of providing a feeder current meter with a kWh capability, only results in enabling a system of theft detection which is mathematically inferior to one based on AIPC (Accumulated In-Phase Current). If AIPC is used instead, there will be a greater ability to detect theft and a greater ability to reduce false alarms, and the feeder current meter will not need any expensive voltage measurement instrumentation.

There are other advantages as well. Since there is no requirement for the feeder current meter to measure voltage, it can be a much smaller, lighter, and safer device. Since it does not need to be connected across any high voltage, no high voltage fuses are required. This reduces the size and weight of the device. Being lightweight means that it can clamp directly onto a feeder with no other means required to support its weight. Thus deployment can be achieved much more quickly, and there is more flexibility with regards to where the device can be installed. Finally, the device is inherently safe. Unlike devices which connect across the high voltage, this device completely eliminates the risk of internal arcing around a fuse enclosure and thus eliminates the danger of explosion during installation.

AIPC (Accumulated In-Phase Current)

AIPC is simply the non-voltage component of energy.

Energy=$\int P dt = \int V*I \, dt$=Accumulation (or integral) of voltage times real current AIPC=$\int I dt$=Accumulation (or integral) of real current where I=real current=non-reactive current=in-phase current Energy is measured in kWh (kilo-Watt-hours) while AIPC is measured in Ah (Amp-hours)

In practice, the magnitude of the in-phase current can be determined in a number of different ways. For example, the current signal could be multiplied by a sinusoidal waveform of fixed amplitude and having the same phase as the voltage. If such a waveform is not available, the voltage waveform could be used instead, but then it would be necessary to continuously divide by the voltage since the voltage waveform is one that continuously varies in amplitude. Even if the voltage waveform is uncalibrated, this would not matter because of the compensating effect of the division as long as the phase is accurate. In fact any sinusoidal waveform which remains proportional to voltage, and has the correct phase and frequency would work, An alternative method would be to measure the amplitude of the current waveform and continuously multiply this by the power factor. The power factor can be determined by taking the cosine of the phase angle between the voltage and the current, or by dividing the active energy by the apparent energy. The active energy is what is normally measured by an electricity meter and accumulated (or integrated over time) while the apparent energy is the RMS (root-mean-squared) of the voltage multiplied by the RMS of the current and accumulated.

If we have a 7.2 kV feeder (phase-to-ground) which is supplying 100 Amps to a steady unchanging load, where the feeder line from the substation to the customer has 0.72 Ohms, the voltage drop over this length of line would be 72 Volts. If the voltage at the substation is 7200 Volts then the voltage at the customer would be 7200−72=7128 Volts. The energy registered at the substation for a one hour period would be 7.2×100=720 kWh. At the load, the metered energy would be 7.128×100=712.8 kWh. In this case ((720−712.8)/720)×100%=1% of the energy is lost due to line losses.

In the next one hour interval the substation supplies 200 Amps during the first 30 minutes and no current for the rest of the interval. During the first 30 minutes 200×7.2×30/60=720 kWh are registered at the substation and therefore also for the entire one hour period as well. At the load, however, the voltage drop is doubled as it is proportional to current and the customer voltage is 7200−(200×0.72)=7056 Volts for the first 30 minutes and 7200 Volts for the following 30 minutes. The energy metered at the customer(s) is then 7056×200×30/60=705.6 kWh for the first 30 minutes and therefore for the entire one hour interval as well. In this case, ((720−705.6)/720)×100%=2% of the energy is lost due to line losses.

Since the same amount of energy (720 kWh) is registered at the substation in both cases, this measurement cannot be used to predict the amount of energy lost to the line. Volt-hours at the customer is also not useful for similar reasons. In both of these cases, there would be 7128 Volt-hours at the customer(s), for the one hour period, and yet in the second case there are 7.2 fewer kWh. Thus an attempt to estimate AIPC by dividing Watt-hours, for a one hour period, by Volt-hours, for the same one hour period, will suffer from the same mathematical error caused by load induced line loss variations.

If true AIPC is used, then in both cases, 100 Ah would be registered at both the substation and at the customer(s) (unless there is theft). If AIPC is not available, then using maximum voltage and minimum voltage to calculate minimum AIPC and maximum AIPC is the next best thing.

The system of the present invention is illustrated schematically in FIG. 1 as item 10 and consists of a plurality of distribution transformers 20 each coupled to a distribution transformer meter 22 which is capable of measuring and recording AIPC. The distribution transformer meter disclosed in co-pending U.S. application Ser. No. 60/949,606 is suitable for use with the present invention. Distribution transformers 20 are each coupled to a load 18 (for example several residential power consumers) and to a high voltage feeder line 12. High voltage feeder line 12 is in turn coupled to a substation transformer 17 in substation 14. Distribution transformer 34 is also coupled to feeder line 12 and data collector 16 is in turn coupled to distribution transformer 34. Each of the distribution transformer meters 22 records the AIPC used by its corresponding load 18 during a given time period and sends this information to data collector 16. Substation transformer 17 is coupled to feeder current meter 24, which, like distribution transformer meters 22, is configured to calculate and record the AIPC for a given time period. Feeder current meter 24 is further configured to send the AIPC measurements to data collector 16, preferably via power-line communications signals. Distribution transformer meters 22 are also configured to transmit their AIPC measurements to data collector 16, also preferably via power-line communications. Data collector 16 then sends these AIPC measurements to central computer 32 which does not need to be near data collector 16 and which can be connected to other data collectors as well. Each distribution transformer meter 22 sends a unique identifier code along with its AIPC measurement; hence, central computer 32 can compare the AIPC measurements received by each distribution transformer meter 22 and compare them to the AIPC measurement for the same time period from feeder current meter 24. This comparison is done by first converting AIPC to normalized active energy or NAE. NAE is simply AIPC multiplied by the nominal voltage. In the case of the distribution transformer meters 22 the nominal voltage would typically be 240 V. For the feeder current meter, the nominal voltage could for example be 7200 V if the transformer transformation ratio is 30. The total NAE derived from distribution transformer meters 22 should be equal to the NAE derived from the measurement recorded by feeder current meter 24 for the same time period within a reasonable margin of measurement error. If there is a significant difference between the totals of the NAE, then this must mean that there is an unknown load attached to the feeder. The utility, which operates central computer 32 can then investigate the extra load.

This system of current accounting is not affected by line losses and is therefore more accurate than energy metering. Also, a device which measures only AIPC at feeder current meter 24 does not require high voltage operation. For this reason, AIPC metering of feeder 12 is much safer and much less expensive than energy metering.

Connectivity Information

The system of the present invention can be used to detect two different kinds of electricity theft. The first kind is theft of electricity from a utility owned distribution transformer. The second kind is the theft of electricity directly from the feeder which can occur with the unauthorized coupling of a distribution transformer directly to the high voltage feeder. The distribution transformer meter detects the first kind of theft in conjunction with electricity meters installed at the end users. The electricity consumption at the distribution transformer must substantially equal the sum of the electricity consumptions at the end users. To do this comparison, however, the utility must know which end users are connected to which distribution transformers. Connectivity information is needed for detecting the second kind of theft as well. This information can be collected using mapping. This involves the generation of two dimensional images or diagrams (which can be on paper or in electronic form for display on computer monitor) which show, in representative form, the feeders the distribution transformers, the end-users and the interconnections between them. Generating these maps involves a fair amount of work, not only to produce them initially, but also to keep them up to date as changes are made to the power system. Even once these maps have been produced and are up to date, there is still some work required to interpret the maps in order to generate the equations which are used to check for the unauthorized use of electricity.

The system of the present invention eliminates the need to produce maps and eliminates the need to interpret them. Instead, a connectivity matrix can be produced automatically to indicate which customer meters (CMs) are connected to which distribution transformer meters (DTMs) and where each distribution transformer is on the feeder relative to the feeder current meters (FCMs). The basic approach is to send power line carrier signals into the grid, at various locations, which are received by units at other locations. The received signals are then processed to provide the necessary connectivity information in the form of a matrix. Software can then use this matrix to automatically generate the equations which are used to check for the unauthorized use of electricity.

The connectivity information requirements can be divided into three categories; namely, 1. DTM to customer meter, 2. FCM to DTM and 3. FCM to CCM (customer Configuration Module). The following is a discussion of how the method of the present invention is used to define all three parts of the connectivity matrix.

1. DTM to Customer Meter

It is necessary to know which customer meter is connected to which distribution transformer. One approach to this is for the data collector to send an instruction signal to all the DTMs on a feeder phase to simultaneously transmit via power line communication (PLC) a unique distribution transformer meter identifier (such as the DTM's serial number) to the customer meters. The DTMs respond by simultaneously sending their serial numbers via PLC. The customer meter receives the serial number from its DTM (i.e. the DTM on the distribution transformer which supplies power to the customer meter) and then transmits the received serial number to its remote data collector together with the customer meter's own unique identifier. This connectivity information is preferably stored in a database coupled to the remote data collector.

While a PLC signal transmitted on the secondary of one transformer can be received at a low level on the secondary sides of other transformers, in practice, the signal strength of these signals will be low enough to be drowned out by the desired signal (i.e. the signal sent and received on the same secondary side) and only the correct serial number should be received. It would still be necessary to measure the signal strength of the received signal so that it will be known if a DTM transmitter has failed to transmit.

2. FCM to DTM

It is necessary to know which section of feeder a distribution transformer is connected to. The feeder section boundaries correspond to the locations on the feeder where FCMs are installed. This can be achieved by dividing an hour into a series of time windows. Each FCM would transmit a uniquely identifiable signal in its own specified time window. Indeed, the specific time window forms part of the uniquely identifiable portion of the signal from the FCM since no two FCMs on a feeder would transmit in the same time window at the same frequency. Instead, the FCMs would transmit in an ordered sequence. The signal traveling upstream from the FCM would be a positive signal (phase+ve) while the signal traveling downstream from the FCM would be a negative signal (phase−ve). The DTM PLC receivers would not only be able to detect the presence of the signal, they would be able to determine from the time window which FCM transmitted the signal, and the phase of the signal (i.e. whether the signal was positive or negative phase). This data is transmitted by each of the DTM's to a remote data collector along with a unique DTM identifier (such as the DTM's serial number) for each DTM. From this data, it would be possible to determine which section of feeder each DTM is connected to. For example let us suppose that a DTM received the following FCM data:

FM1 −
FM2 −
FM3 +
FM4 +

In this case it would then be known that the DTM was connected to the feeder section between FM2 and FM3.

This method of determining where each DTM is in relation to the feeder current meters is illustrated in FIG. 1. The process begins with the data collector 16 sending, via power line carrier communications, a carrier duplicate instruction to all of the feeder current meters on the feeder. This instruction is followed by a pure carrier sent by the data collector for a fixed length of time. Then the feeder current meters 24, 26, and 28 transmit in succession a duplicate carrier which is substantially identical in frequency and phase using an inductive coupling to the feeder. The inductive coupling, used by the feeder meter power line carrier transmitter, results in the signal going up-stream from the feeder meter being 180 degrees out of phase with the signal going down-stream. Thus these signals can be classified as positive signals or negative signals. All of the DTMs 22 on the feeder record, for each feeder current meter, whether they have received a positive or negative signal. This information is relayed to the data collector 16 on request and thus the data collector 16 is not only provided with the AIPC (or energy or both) measurements from all of the feeder current meters 24, 26, and 28 and DTMs 22, but is also provided with all the information required to do the comparisons for theft detection, thus eliminating the need to do any mapping.

Figure 2:
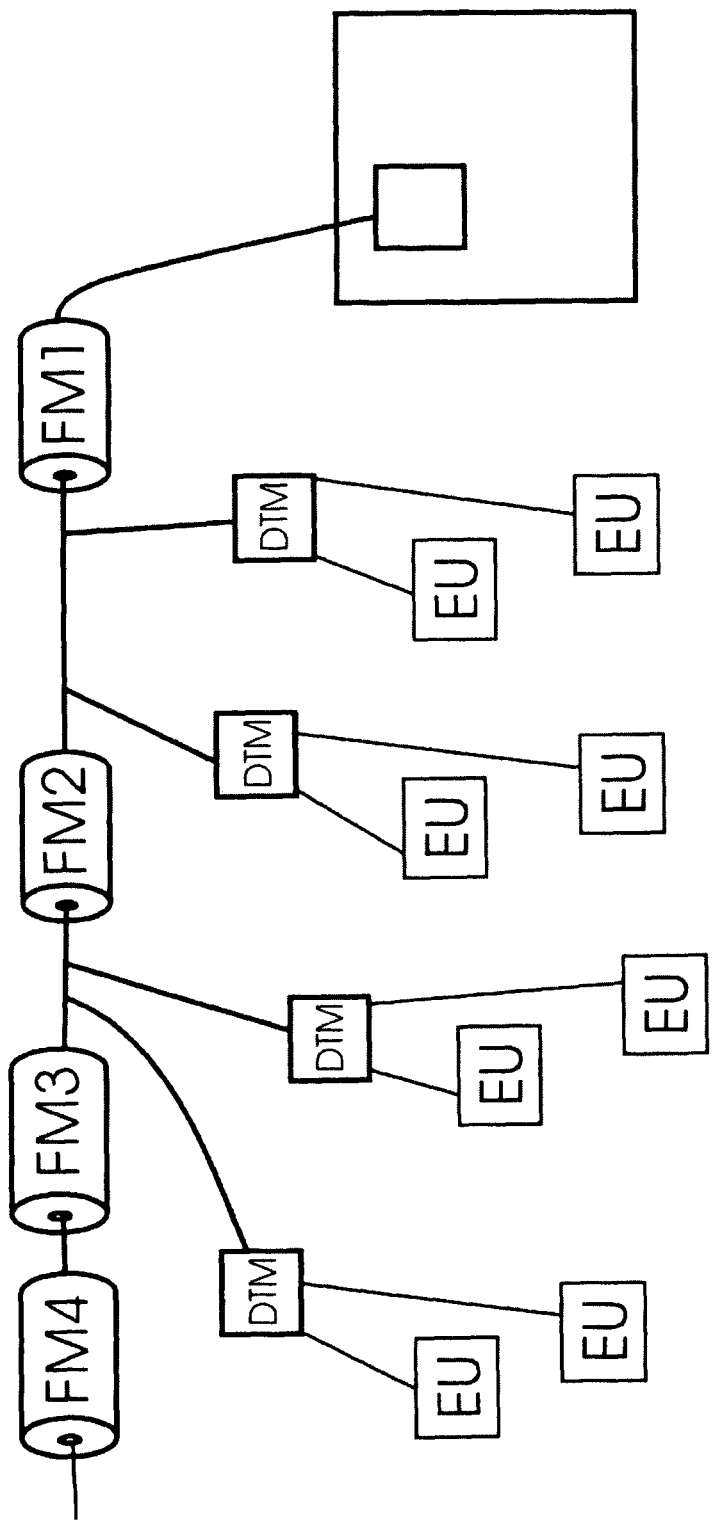
FIG. 2 is a schematic view of an electricity network implementing the method of the present invention and showing the relationship of end users (EUs) to distribution transformers (DTs).

Referring now to FIG. 2, all of the DTMs connected to the feeder segment between feeder current meter FM2 and feeder current meter FM3 will receive a negative signal from feeder current meter FM2 and a positive signal from feeder current meter FM3. Any DTMs on the other side of the feeder current meter FM3 would receive a negative signal from both feeder current meters, and all of the DTMs on the other side of feeder current meter FM2 will receive positive signals from both feeder current meters. Thus the sum of the NAE measurements of all the DTMs which receive a negative signal from feeder current meter FM2 and a positive signal from feeder current meter FM3 should substantially equal the NAE measurement of feeder current meter FM2 minus the NAE measurement of feeder current meter FM3.

A potential difficulty could arise if there was a three phase capacitor bank which transferred the signals from one feeder phase to the other two feeder phases. It would then be necessary to be able to determine not only which phase each FCM is installed on, but also which phase each DTM is installed on, however, without the capacitor bank, this can be easily determined because signals transmitted on one feeder phase would not be received on the other two phases.

The capacitor bank or anything else which causes the signal from one feeder phase to be coupled to the other two phases makes this task more difficult. One possible solution to this is to have the FCM transmit a signal which is modulated by the 60 Hz power signal on its feeder phase. The DTM receiver would then demodulate this signal to recover the original 60 Hz signal. It would then measure the phase angle between this signal and the voltage that it is connected to. If the phase angle difference is close to zero or 180 degrees, then it would be known that this signal came from a FCM on the same feeder phase. If the phase angle difference is close to 120 degrees or 60 degrees, then it would be known that the signal originated on one of the other two feeder phases. It could be further determined which of the other two feeder phases the FCM was located on by determining whether the phase difference of 120 degrees or 60 degrees was leading or lagging.

3. FCM to Customer Configuration Module

In sparsely populated rural areas, it is common to have only one customer for each distribution transformer. Cost considerations are expected to prevent the deployment of DTMS on these transformers. Therefore, it is necessary for another device, a customer configuration module (CCM) to perform the functions described in the previous section 2. This unit could be like a DTM installed at the distribution transformer, except that it does not sense or measure current, or it could be a module which plugs in somewhere in the customer's residence.

Signal Processing Requirements

1. Accurate Time-Base (Low Drift)

For a CCM to be able to detect and process signals from the FCM and for a meter to be able to detect and process signals from the DTM, it is necessary to have a demodulation algorithm with an accurate time-base. A suitable time-base algorithm is described in U.S. Pat. No. 6,549,120.

2. Signal and Phase Detection

It will be necessary to determine which phase of the feeder the DTM or CCM is coupled to. This can be done by sending a feeder current meter signal on a carrier from the feeder to the DTM or CCM. This reference signal is sent for a period of which may need to be up to ten minutes long to give a DTM or CCM a chance to find the phase angle of the carrier. The feeder current meter signal will need to be modulated by the power system frequency on the phase which the signal is sent. The DTM or CCM receives the modulated feeder current meter signal and demodulates it. The demodulation can be done by the DTM or CCM producing a demodulation frequency with a small frequency offset from normal carrier frequency. The demodulated output would then be a slow sine wave with zero-crossings that can be determined. One method would be to wait for such a zero-crossing, and then remove the frequency offset. A phase offset of 90 degrees could then be applied to the demodulation signal to bring the demodulation signal in line with the received signal. An additional phase offset may need to be applied to compensate for delays in the filtering of the demodulated signal. Once this phase alignment is achieved, it should remain free of drift for the entire duration of the configuration detection process due to the accuracy of the time-base.

After the reference frequency transmission is complete, the received signal is demodulated for the purpose of determining configuration. It is necessary for the DTM or CCM to be able to distinguish between positive and negative signals (phase angle of 0 or 180) for single feeder phase connectivity detection, and other phase angles as well for rejecting signals from other feeders.

3. Time Window Detection

It is necessary for the DTM or CCM to be able to determine the time window in which a signal was received. This requires that the DTM or CCM have a clock with an error less than one half of the time window length for this to even be possible, but ideally, for good performance, it needs to be less than one $16^{th}$ of the time window length. In some cases, this may require a resynchronizing of the clocks to avoid the need for long time windows which would make the configuration detection process very slow.

4. Data Decoding

It is necessary for the customer meter to be able to decode data in the form of serial numbers for communication from the DTM to the meter.

5. Signal Level

It is necessary for the customer meter to be able to determine the signal strength so that signals from DTMs in other distribution transformers can be rejected in the event that the DTM on the same distribution transformer as the customer meter fails to transmit.

6. Three-Phase Cross-Talk Rejection

On a three-phase circuit where signals are coupled together, it is necessary to have a method for rejecting signals originating on either of the two other phases. This requires that the data collector or other device be able to decode the 60 Hz frequency modulation on the transmitted FCM signal to determine whether the phase of the demodulated signal matches the phase of the 60 Hz power signal connected to the customer meter (or distribution transformer meter). Since the demodulation filtering would need to be slow in order to pick out the signal from the background noise, the 60 Hz waveform may need to be demodulated on a piece-wise basis. The resolution with which this can be done is limited by the sampling frequency.

It is not necessary that this cross-talk rejection be done simultaneously with other configuration processes. This can be a separate function. Nevertheless, the system must know either which phase a customer meter is connected to, or which customer meters go with which FCMs. Since all of the FCMs, including the ones on other phases, will each have a different time window, there should be no interference between FCMs on different phases.

An alternative method of determining which of the three phases a meter is connected to is to use voltage profiling. As the load on a feeder goes up and down during the day, the voltage is affected. This voltage can be profiled at the customer meter. Since the three phases on a feeder do not see exactly the same load, each phase will have its own unique voltage signature, and this signature can be recorded at the customer meter or CCM and sent to a central computer. The central computer then compares the signature recorded at the customer meter or CCM with the voltage signature for the three phases and determines which has the best match. It also determines how good the match is. If the match is not good enough to provide sufficient certainty as to which feeder phase the meter is connected to, the central computer continues the process with additional data until the required level of certainty is achieved.

FIG. 2 shows a number of feeder current meters (FM1, FM2, FM3 and FM4), distribution transformers (DT), and end-users (EU). Just as it is necessary to know which end-users are connected to which distribution transformers, it is also necessary to know which distribution transformers are associated with which feeder current meter and how. For connectivity detection, the situation is more complicated at the feeder level. The simplest feeder current meter topology would be one where a single feeder current meter monitors the entire feeder and its NAE values are compared to the NAE values for all of the distribution transformers, however, the accuracy limitations could result in total measurement error being greater than the amount of theft in which case the theft would not be detected. Thus it may be necessary to have more than one feeder current meter along the feeder and its branches. The distribution transformers are then not associated with any one feeder current meter. Instead they are associated with the feeder segment between two feeder current meters. The difference between the NAE measurements of two feeder current meters should be substantially equal to the sum of the DTM NAE measurements of all of the utility owned distribution transformers on the feeder segment between the two feeder current meters.

A specific embodiment of the present invention has been disclosed; however, several variations of the disclosed embodiment could be envisioned as within the scope of this invention. It is to be understood that the present invention is not limited to the embodiments described above, but encompasses any and all embodiments within the scope of the following claims.

Therefore, what is claimed is:

1. A method of metering electricity, comprising:
   calculating a first accumulated in-phase current indicative of a non-voltage component of energy flow to one or more customer premises during a period of time by a distribution transformer meter (DTM) coupled to a distribution transformer (DT);
   calculating a second accumulated in-phase current (AIPC) indicative of a non-voltage component of energy flow during a period of time by a feeder current meter coupled to a feeder line; and
   transmitting the first AIPC and the second AIPC to a data collecting computing device;
   comparing the first AIPC with the second AIPC to determine if electricity theft has occurred.

2. The method of claim 1, wherein the comparing step comprises converting the first AIPC and the second AIPC to a first and second normalized active energy (NAE) value, respectively.

3. The method of claim 2, wherein the converting step further comprises multiplying the first AIPC and the second AIPC by an operating voltage of the DTM and the FCM, respectively.

4. The method of claim 3, further comprising detecting theft if the first NAE value is not substantially equal to the second NAE value.

* * * * *